US009935623B2

(12) United States Patent
Costa (10) Patent No.: US 9,935,623 B2
(45) Date of Patent: Apr. 3, 2018

(54) METHOD AND APPARATUS FOR PROVIDING AN ADJUSTABLE HIGH RESOLUTION DEAD TIME

(71) Applicant: Infineon Technologies AG, Neubiberg (DE)

(72) Inventor: Pedro Costa, Munich (DE)

(73) Assignee: Infineon Technologies AG, Neubiberg (DE)

( * ) Notice: Subject to any disclaimer, the term of this patent is extended or adjusted under 35 U.S.C. 154(b) by 82 days.

(21) Appl. No.: 15/211,496

(22) Filed: Jul. 15, 2016

(65) Prior Publication Data
US 2017/0040988 A1 Feb. 9, 2017

(30) Foreign Application Priority Data

Jul. 17, 2015 (DE) .................. 10 2015 009 245

(51) Int. Cl.
| | |
|---|---|
| H03K 7/08 | (2006.01) |
| H02M 1/38 | (2007.01) |
| H03K 5/06 | (2006.01) |
| H03K 5/135 | (2006.01) |
| H03K 5/00 | (2006.01) |

(52) U.S. Cl.
CPC .............. *H03K 7/08* (2013.01); *H02M 1/38* (2013.01); *H03K 5/06* (2013.01); *H03K 5/135* (2013.01); *H03K 2005/00019* (2013.01)

(58) Field of Classification Search
CPC ........... H02M 1/38; H03K 5/06; H03K 5/135; H03K 7/08; H03K 2005/00019
See application file for complete search history.

(56) References Cited

U.S. PATENT DOCUMENTS

| | | | | |
|---|---|---|---|---|
| 7,057,910 B2 * | 6/2006 | Takahashi | ............... | H02M 1/38 323/283 |
| 7,288,916 B2 * | 10/2007 | Mitsuki | ................... | H02M 1/38 318/723 |
| 7,804,379 B2 * | 9/2010 | Kris | ....................... | H02M 1/38 332/109 |
| 8,278,988 B2 * | 10/2012 | Mienkina | ................. | H03K 7/08 327/170 |
| 8,816,621 B2 * | 8/2014 | Minami | ................... | H02P 27/08 318/400.11 |
| 8,994,426 B2 * | 3/2015 | Bhaumik | .............. | H03L 7/0805 327/149 |
| 9,041,375 B2 * | 5/2015 | Costa | .................... | H02M 3/157 323/283 |
| 9,118,311 B1 * | 8/2015 | Lancaster | ............. | H03K 5/159 |

* cited by examiner

*Primary Examiner* — Patrick O'Neill
(74) *Attorney, Agent, or Firm* — Eschweiler & Potashnik, LLC (57) ABSTRACT

The disclosure generally relates to a method and an apparatus for providing an adjustable high resolution dead time, and more specifically, to a method and an apparatus for inserting an adjustable high resolution dead time in a PWM signal. A method for inserting an adjustable high resolution dead time in a PWM signal includes receiving a clock signal at a delaying circuitry and generating, by the delaying circuitry, a plurality of phases, receiving the generated plurality of phases at a first multiplexer, and selecting and forwarding, by the first multiplexer, a first phase of the plurality of phases based on a first high resolution dead time value. The method further includes shifting a rising edge and/or a falling edge of the PWM signal using the received first phase forwarded by the first multiplexer.

21 Claims, 3 Drawing Sheets

METHOD AND APPARATUS FOR PROVIDING AN ADJUSTABLE HIGH RESOLUTION DEAD TIME

CROSS REFERENCE TO RELATED APPLICATION

This application claims priority to German Patent Application number 102 015 009 245.6 filed Jul. 17, 2015 which is hereby incorporated by reference in its entirety.

FIELD

The invention generally relates to a method and an apparatus for providing an adjustable high resolution dead time, and more specifically, to a method and an apparatus for inserting an adjustable high resolution dead time in a PWM signal.

BACKGROUND

Pulse-width modulation (PWM) is a technique for encoding a message into a pulsing signal. Although this modulation technique can thus be used to encode information for transmission, its main use is to allow control of the power supplied to electrical devices, especially to inertial loads such as motors.

The average value of voltage (and current) fed to a load is controlled by turning a switch between supply and load on and off at a fast rate. The longer the switch is on compared to the off periods, the higher the total power supplied to the load.

The PWM switching frequency has to be much higher than what would affect the load (the device that uses the power), such that the resultant waveform perceived by the load must be as smooth as possible. Typically switching has to be done several times a minute in an electric stove, 120 Hz in a lamp dimmer, from few kilohertz (kHz) to tens of kHz for a motor drive and well into the tens or hundreds of kHz in audio amplifiers and computer power supplies.

The term duty cycle describes the proportion of "on" time to the regular interval or period of time; a low duty cycle corresponds to low power, because the power is off for most of the time. Duty cycle is expressed in percent, 100% being fully on.

The main advantage of PWM is that power loss in the switching devices is very low. When a switch is off, there is practically no current, and when it is on and power is being transferred to the load, there is almost no voltage drop across the switch. Power loss, being the product of voltage and current, is thus in both cases close to zero. PWM also works well with digital controls, which, because of their on/off nature, can easily set the needed duty cycle.

PWM can be used to control the amount of power delivered to a load without incurring the losses that would result from linear power delivery by resistive means. Drawbacks to this technique are that the power drawn by the load is not constant but rather discontinuous, and energy delivered to the load is not continuous either. Power flow from the supply is not constant and will require energy storage on the supply side in most cases.

PWM power control systems are easily realisable with semiconductor switches such as MOSFETs or insulated-gate bipolar transistors (IGBTs). As explained above, almost no power is dissipated by the switch in either on or off state. However, during the transitions between on and off states, both voltage and current are nonzero and thus power is dissipated in the switches. By quickly changing the state between fully on and fully off, the power dissipation in the switches can be quite low compared to the power being delivered to the load. The use of synchronous switch topologies such as a half-bridges or synchronous buck converters, further reduces power losses, but leads to a significant increase of circuit complexity.

In a half-bridge, synchronous buck converter, or other synchronous switch topologies, a switch driver has to be implemented to prevent both switches from being turned on at the same time, a fault known as "shootthrough". The simplest technique for avoiding shootthrough is a time delay between the turn-off of a first switch to the turn-on of second switch, and vice versa. However, setting this time delay long enough to ensure that the first and second switch are never both on at the same time will itself result in excess power loss.

Thus, in switched mode power supplies, when using synchronous switch topologies, such as half-bridges or synchronous buck converters, insertion of a dead time between the turn on and turn off of the complementary switches is required. While this dead time insertion avoids shorts between the switches, it will impact the overall efficiency of the converter itself if the length of the dead time is not correctly set. The required dead time is however not constant as it not only depends on the operating conditions of the converter, such as temperature variation or degradation, but also depends on the current conditions of the system as the optimal value also depends on the output load of the power supply. This imposes that the dead time has to be modified/updated on-the-fly via a control loop.

In current or at least future synchronous topologies, the dead time, due to the increasing switching frequency of the converters, needs to be adjusted with very fine granularity (sub nanosecond range) together with the ON/OFF of the PWM duty cycle. But this imposes that a counter needs to be started upon a transition in the PWM signal (ON or OFF) that contains the actual value of the dead time, e.g. 5.5 ns and be decoded on-the-fly. This means that it is currently very complicated, if not impossible to decode a counter value on-the-fly in the order of picoseconds and apply a gating/ungating on the PWM signal to generate this highly accurate dead time.

For these or other reasons there is a need for an improved method and/or apparatus for controlling current in an array cell.

SUMMARY

In accordance with an aspect of the invention, there is provided a method for inserting an adjustable high resolution dead time in a PWM signal. The method comprises receiving a clock signal at a delaying circuitry and generating, by the delaying circuitry, a plurality of phases; receiving the generated plurality of phases at a first multiplexer; selecting and forwarding, by the first multiplexer, a first phase of the plurality of phases based on a first high resolution dead time value; and shifting a rising edge and/or a falling edge of the PWM signal using the received first phase forwarded by the first multiplexer.

In accordance with a further aspect of the invention, there is provided an apparatus for inserting an adjustable high resolution dead time in a PWM signal. The apparatus comprises delaying circuitry configured to receive a clock signal and output a plurality of phases; a first multiplexer coupled to the delaying circuitry to receive the plurality of phases output by the delaying circuitry and configured to forward a first phase of the plurality of phases based on a first high resolution dead time value; and circuitry coupled to the first multiplexer to receive the first phase forwarded by the first multiplexer and configured to receive the PWM signal and shift a rising edge and/or a falling edge of the PWM signal using the received first phase forwarded by the first multiplexer.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated, as they become better understood by reference to the following detailed description.

DETAILED DESCRIPTION

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. The following detailed description, therefore, is not to be taken in a limiting sense, and the scope of the present invention is defined by the appended claims.

Figure 1:
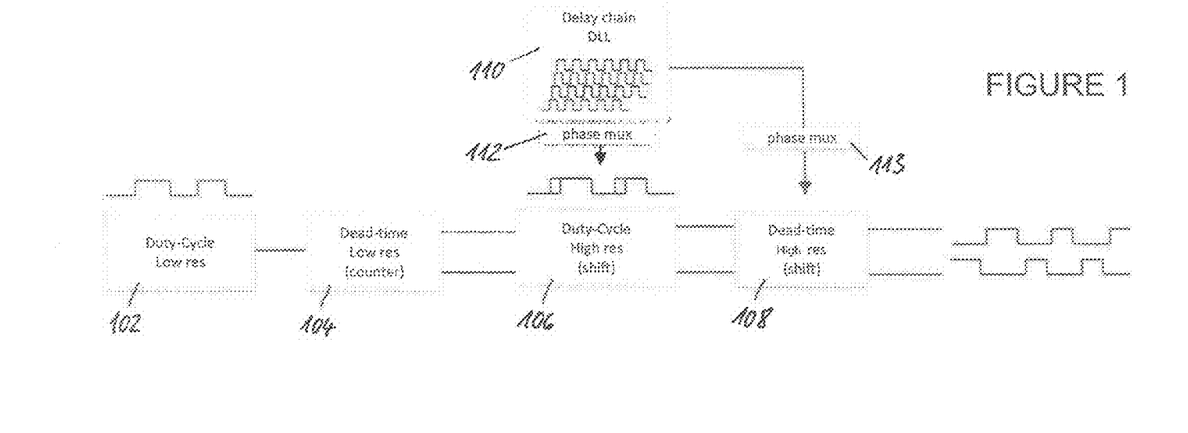
FIG. 1 shows a schematic diagram of a PWM duty cycle and dead time insertion pipeline according to an embodiment of the invention.

FIG. 1 shows a schematic diagram of a PWM duty cycle and dead time insertion pipeline according to an embodiment of the invention.

FIG. 1 shows a plurality of pipeline stages comprising a first stage 102, a second stage 104, a third stage 106, and a fourth stage 108.

In the first stage 102, a low resolution duty cycle is generated based on a low resolution duty cycle value, which may be carried out using a timer or counter, for example. A signal comprising the low resolution duty cycle is forwarded to the second stage 104.

In the second stage 104, a complementary signal is generated, i.e. a low resolution duty cycle complementary to the low resolution duty cycle of the received signal is generated. A low resolution dead time is inserted in the signal and the complementary signal wherein the low resolution dead time is greater than or equal to 0. Thus, two signals comprising a pair of complementary low resolution duty cycles with low resolution dead times are provided in the second stage 104. Again, a timer or counter may be used for generating the low resolution dead time based on a low resolution dead time value. A pair of signals comprising the low resolution duty cycles with low resolution dead times is forwarded to the third stage 106.

In the third stage 106, a high resolution duty cycle is provided by shifting the edges of the ON/OFF and/or OFF/ON transitions of the signals received from the second stage 104. A delay chain or delay-locked loop (DLL) 110 may be used for providing a plurality of phases. A gate delay or a delay string may also be used however. A phase multiplexer 112 may receive the plurality of phases from the delay chain or DLL 110, select one of the received phases based on a high resolution duty cycle value and forward the selected phase to circuitry configured to shift the edges of the ON/OFF and/or OFF/ON transitions of the two received signals using the selected phase forwarded by the phase multiplexer 112. The signals having the generated high resolution duty cycles are forwarded to the fourth stage 108.

In the fourth stage 108, a high resolution dead time is inserted by shifting the edges of the ON/OFF and/or OFF/ON transitions of the signals received from the third stage 106. A delay chain or DLL 110 may be used for providing a plurality of phases, wherein the used delay chain or DLL may be the one used in the third stage 106 (as shown in FIG. 1) or may be another delay chain or DLL. A phase multiplexer 113 may receive the plurality of phases from the delay chain or DLL, select one of the received phases based on a high resolution dead time value and forward the selected phase to circuitry configured to shift the edges of the ON/OFF and/or OFF/ON transitions of the two received signals using the selected phase forwarded by the phase multiplexer 113. The fourth stage outputs two signals comprising high resolution duty cycles having inserted high resolution dead times.

The high resolution duty cycle value input to the third stage 106 and the high resolution dead time value input to the fourth stage 108 may be provided and updated by software wherein the high resolution duty cycle values and the high resolution dead time values may be calculated/updated by software in different time slots and/or with different periodicity, i.e. they need not be calculated/updated at the same time. The high resolution duty cycle and high resolution dead time are inserted by shifting the edges of ON/OFF and/or OFF/ON transitions in the respective signal using suitable phases selected based on values provided and updated by software. Thus, as on-the-fly decoding of counters limiting the speed and/or resolution of dead time insertion, is no longer required highly accurate dead time insertion (i.e. high resolution of dead time insertion) is achieved.

Figure 2:
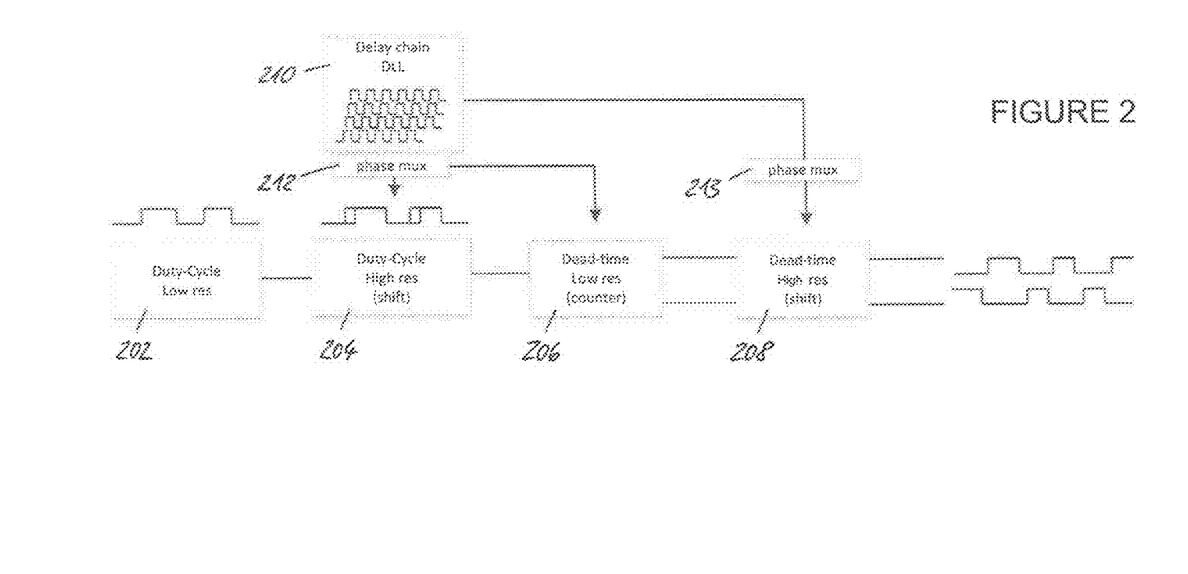
FIG. 2 shows a schematic diagram of a PWM duty cycle and dead time insertion pipeline according to a further embodiment of the invention.

FIG. 2 shows a schematic diagram of a PWM duty cycle and dead time insertion pipeline according to a further embodiment of the invention.

FIG. 2 shows a plurality of pipeline stages comprising a first stage 202, a second stage 204, a third stage 206, and a fourth stage 208.

In the first stage 202, a low resolution duty cycle is generated based on a low resolution duty cycle value, which may be carried out using a timer or counter, for example. A signal comprising the low resolution duty cycle is forwarded to the second stage 204.

In the second stage 204, a high resolution duty cycle is provided by shifting the edges of the ON/OFF and/or OFF/ON transitions of the signal comprising the low resolution duty cycle received from the first stage 202. A delay chain or delay-locked loop (DLL) 210 may be used for providing a plurality of phases. A phase multiplexer 212 may receive the plurality of phases from the delay chain or DLL 210, select one of the received phases based on a high resolution duty cycle value and forward the selected phase to circuitry configured to shift the edges of the ON/OFF and/or OFF/ON transitions of the received signal using the selected phase forwarded by the phase multiplexer 212. The signal with the generated high resolution duty cycle is forwarded to the third stage 206.

In the third stage 206, a complementary signal is generated, i.e. a high resolution duty cycle complementary to the high resolution duty cycle of the received signal is generated. A low resolution dead time is inserted in the signal and the complementary signal wherein the low resolution dead time is greater than or equal to 0. Thus, two signals comprising a pair of complementary high resolution duty cycles with low resolution dead times are provided in the third stage 206. Again, a timer or counter may be used for generating the low resolution dead time based on a low resolution dead time value. A pair of signals comprising the high resolution duty cycles with low resolution dead times is forwarded to the fourth stage 208.

In the fourth stage 208, a high resolution dead time is inserted by shifting the edges of the ON/OFF and/or OFF/ON transitions of the signals received from the third stage 206. A delay chain or DLL 210 (or a gate delay or delay string) may be used for providing a plurality of phases, wherein the used delay chain or DLL may be the one used in the second stage 204 (as shown in FIG. 2) or may be another delay chain or DLL. A phase multiplexer 213 may receive the plurality of phases from the delay chain or DLL, select one of the received phases based on a high resolution dead time value and forward the selected phase to circuitry configured to shift the edges of the ON/OFF and/or OFF/ON transitions of the two received signals using the selected phase forwarded by the phase multiplexer 213. The fourth stage outputs two signals comprising high resolution duty cycles having inserted high resolution dead times.

The high resolution duty cycle value input to the second stage 204 and the high resolution dead time value input to the fourth stage 208 may be provided and updated by software wherein the high resolution duty cycle values and the high resolution dead time values may be calculated/updated by software in different time slots and/or with different periodicity, i.e. they need not be calculated/updated at the same time. The high resolution duty cycle and high resolution dead time are inserted by shifting the edges of ON/OFF and/or OFF/ON transitions in the respective signal using suitable phases selected based on values provided and updated by software. Thus, as on-the-fly decoding of counters limiting the speed and/or resolution of dead time insertion, is no longer required highly accurate dead time insertion (i.e. high resolution of dead time insertion) is achieved.

Figure 3:
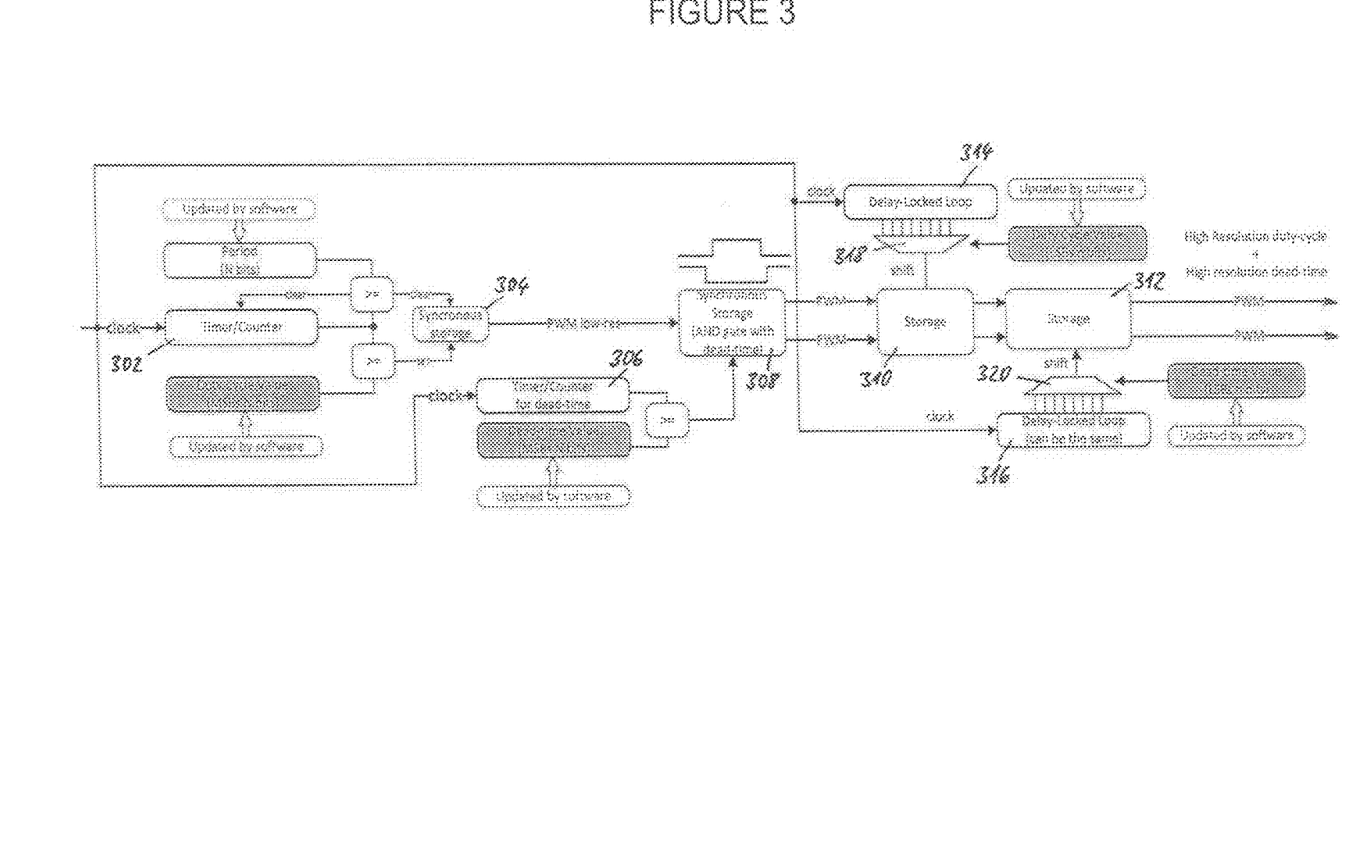
FIG. 3 shows a schematic diagram of a PWM duty cycle and dead time insertion pipeline according to a further embodiment of the invention.

FIG. 3 shows a schematic diagram of an apparatus for generating PWM signals having adjustable high resolution duty cycles and adjustable high resolution dead times.

The apparatus shown in FIG. 3 may comprise, in a first stage, a first timer or counter 302 and a first synchronous storage 304 such as a first flip-flop, for example; in a second stage, a second timer or counter 306, and a second synchronous storage 308 such as a second flip-flop, for example; in a third stage, a first storage 310, a first delay-locked loop (DLL) 314 and a first multiplexer 318; and, in a fourth stage, a second storage 312, a second DLL 316, and second multiplexer 320. It is to be noted that gate delays or delay strings may also be used instead of the first and second DLLs.

In the first stage, a low resolution PWM duty cycle is generated. The first counter 302 receives a clock signal and outputs a count value which is compared to a low resolution duty cycle value and also compared to a period length value indicating the whole length of a period. The low resolution duty cycle value and the period length value may be provided and updated by software. If the count value is smaller than or equal to the low resolution duty cycle value a "1" (i.e. an ON signal) may be output to the first synchronous storage 304. If the count value is greater than the low resolution duty cycle value a "0" (i.e. an OFF signal) may be output to the first synchronous storage 304. The first synchronous storage 304 forwards the received value/signal to the second stage before it receives the next value/signal. This is done as long as the count value is smaller than or equal to the period length value, i.e. for the duration of a whole period. When the count value is greater than the period length value (i.e. after one whole period) the first synchronous storage 304 is cleared, the first counter 302 is reset, and the procedure described above starts again to generate a low resolution PWM duty cycle for the next duty cycle period.

In the second stage, a low resolution dead time is inserted in the signal received from the first stage and in a complementary signal comprising a low resolution PWM duty cycle complementary to the low resolution PWM duty cycle of the signal received from the first stage. The low resolution dead time is greater than or equal to 0.

The second counter 306 receives the signal provided by the first stage and the clock signal. When a transition (from "0" to "1" or from "1" to "0", for example) occurs in the signal received from the first stage, the second counter 306 is reset and starts to count. The count value output by the second counter 306 is compared to a low resolution dead time value. If the count value is smaller than or equal to the low resolution dead time value, a "0" (or "OFF" signal) may be output and otherwise (if the count value is greater than the low resolution dead time value) a "1" (or "ON" signal) may be output. This value (e.g. "0" or "1") and the signal received from the first stage are input to a first AND gate. In addition, this value (e.g. "0" or "1") and the complementary signal are input to a second AND gate. The first and second AND gate may forward their respective outputs, the signal and complementary signal with low resolution dead time, to the second synchronous storage 308 which forwards them to the third stage. However, as the synchronous storage 308 is optional, the first and second AND gate may directly forward their respective outputs to the third stage if no second synchronous storage 308 is comprised in the apparatus of FIG. 3.

The low resolution dead time value which may be provided and updated by software may comprise a first low resolution dead time value for rising edges of the PWM duty cycle and a second low resolution dead time value for falling edges of the PWM duty cycle. That is, a first low resolution dead time according to the first low resolution dead time value is inserted at rising edges (e.g. transitions from "0" to "1") of the duty cycles of the signal and the complementary signal and a second low resolution dead time according to the second low resolution dead time value is inserted at falling edges (e.g. transitions from "1" to "0") of the duty cycles of the signal and the complementary signal.

In the third stage, a high resolution duty cycle is generated for the signal and the complementary signal, i.e. the low resolution duty cycles of the signal and the complementary signal are adjusted or shifted based on a high resolution duty cycle value to provide high resolution duty cycles.

The first DLL 314 receives the clock signal and generates therefrom a plurality of different phases and forwards them to the first multiplexer 318. Based on a high resolution duty cycle value, the first multiplexer 318 selects and forwards one phase of the plurality of phases provided by the first DLL 314. The signal and the complementary signal received from the second stage are sampled with the selected phase which causes a shift of e.g. the rising edges of the signal and the complementary signal. Alternatively, the signal and the complementary signal received from the second stage may be sampled with the selected phase such that a shift of e.g. the falling edges of the signal and the complementary signal results. The resulting signal and the complementary signal are output to the first storage 310 which forwards them to the fourth stage.

In the fourth stage, high resolution dead times are inserted in the signal and the complementary signal received from the third stage. That is, the low resolution dead times inserted in the signal and the complementary signal in the second stage are adjusted or shifted based on at least one high resolution dead time value to provide high resolution dead times.

A DLL which may be the first DLL 314 of the third stage or may be a second DLL 316 different to the first DLL 314 (as depicted in FIG. 3) receives the clock signal and generates therefrom a plurality of different phases and forwards them to the second multiplexer 320. Based on a high resolution dead time value, the second multiplexer 320 selects and forwards one phase of the plurality of phases provided by the DLL (i.e. the first DLL 314 or the second DLL 316). The signal and the complementary signal received from the third stage are sampled with the selected phase which causes a shift of the e.g. rising edges (or e.g. falling edges) of the signal and the complementary signal.

The high resolution dead time value which may be provided and updated by software may comprise a first high resolution dead time value for rising edges of the PWM signals and a second high resolution dead time value for falling edges of the PWM signals. That is, rising edges (e.g. transitions from "0" to "1") of the PWM signals are shifted according to the first high resolution dead time value and falling edges (e.g. transitions from "1" to "0") of the PWM signals are shifted according to the second high resolution dead time value. For this, an additional multiplexer (not shown in FIG. 3) receiving the plurality of phases from the DLL (i.e. the first DLL 314 or the second DLL 316) is required.

If it is desired to insert different dead times for the PWM signal and the complementary PWM signal, an additional multiplexer (not shown in FIG. 3) receiving the plurality of phases from the DLL (i.e. the first DLL 314 or the second DLL 316) is required. In this case, the second multiplexer 320 may select and forward a first phase according to a high resolution dead time value for the PWM signal and the additional multiplexer may select and forward a second phase according to a high resolution dead time value for the complementary PWM signal.

If it is desired to insert not only different dead times at rising and falling edges of the PWM signals, but also different dead times for the PWM signal and the complementary PWM signal, three additional multiplexers (not shown in FIG. 3) receiving the plurality of phases from the DLL (i.e. the first DLL 314 or the second DLL 316) are required.

The low resolution duty cycle value may comprise the most significant bits (MSBs) of a complete duty cycle value and the high resolution duty cycle value may comprise the least significant bits (LSBs) of the complete duty cycle value. For example, the MSBs of the duty cycle value may indicate the time during which the PWM duty cycle is high ("ON" or "1") as whole number of clock cycles of the clock signal and the LSBs of the duty cycle value may indicate the additional time during which the PWM duty cycle is also high ("ON" or "1") as fractions of one clock cycle of the clock signal.

The low resolution dead time value may comprise the most significant bits (MSBs) of a complete dead time value and the high resolution dead time value may comprise the least significant bits (LSBs) of the complete dead time value. For example, the MSBs of the dead time value may indicate the duration of the dead time as whole number of clock cycles of the clock signal and the LSBs of the dead time value may indicate the additional duration of the dead time as fractions of one clock cycle of the clock signal.

As described above, the high resolution duty cycle and high resolution dead time are inserted by shifting the edges of ON/OFF and/or OFF/ON transitions in the respective signal using suitable phases selected based on values provided and updated by software wherein the high resolution duty cycle values and the high resolution dead time values may be calculated/updated by software in different time slots and/or with different periodicity, i.e. they need not be calculated/updated at the same time. As on-the-fly decoding of counters limiting the speed and/or resolution of dead time insertion is no longer required, highly accurate dead time insertion (i.e. high resolution of dead time insertion) can be achieved. Thus, a PWM signal having highly accurate ON/OFF time and dead time can be generated in the order of picoseconds.

Figure 4:
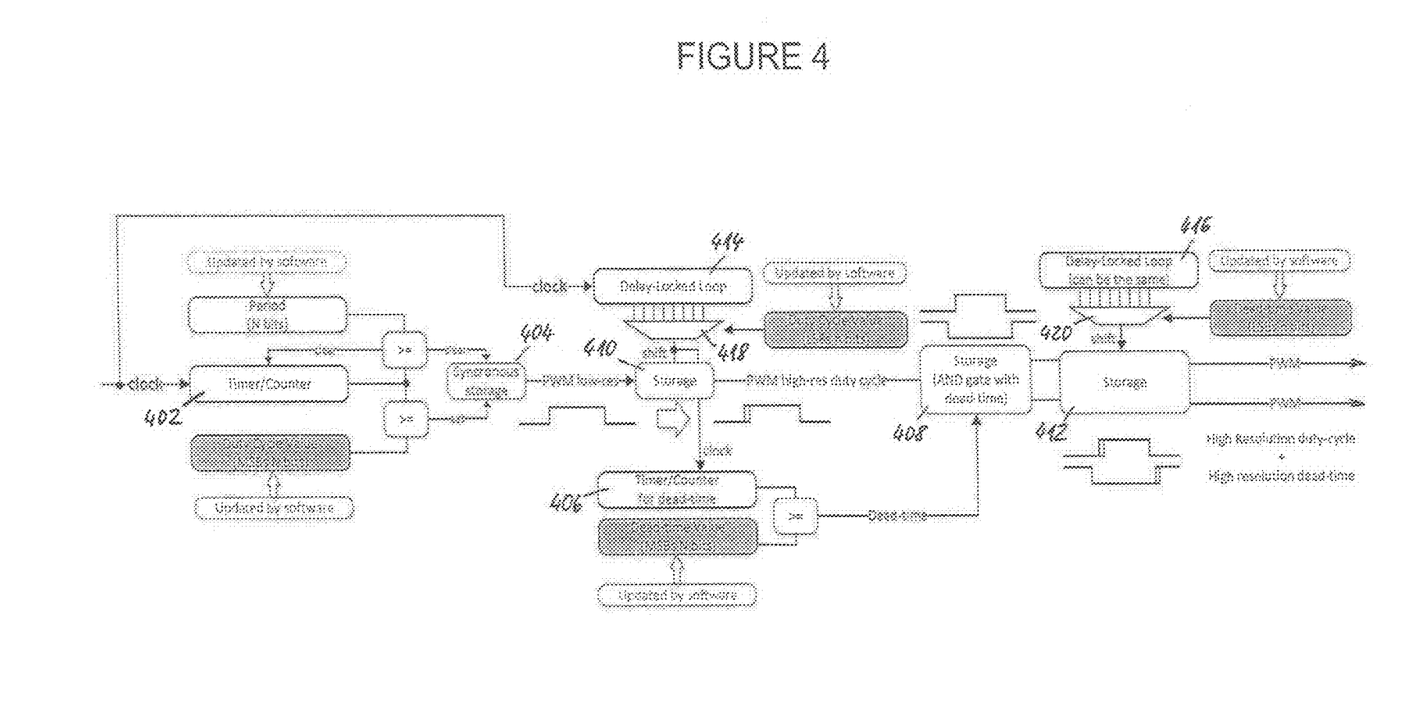
FIG. 4 shows a schematic diagram of a PWM duty cycle and dead time insertion pipeline according to a further embodiment of the invention.

FIG. 4 shows a schematic diagram of an apparatus for generating PWM signals having adjustable high resolution duty cycles and adjustable high resolution dead times.

The apparatus shown in FIG. 4 may comprise, in a first stage, a first timer or counter 402 and a first synchronous storage 404 such as a first flip-flop, for example; in a second stage, a first storage 410, a first delay-locked loop (DLL) 414 and a first multiplexer 418; in a third stage, a second timer or counter 406, and a second storage 408 such as a second flip-flop, for example; and, in a fourth stage, a third storage 412, a second DLL 416, and second multiplexer 420. It is to be noted that gate delays or delay strings may also be used instead of the first and second DLLs.

In the first stage, a low resolution PWM duty cycle is generated. The first counter 402 receives a clock signal and outputs a count value which is compared to a low resolution duty cycle value and also compared to a period length value indicating the whole length of a period. The low resolution duty cycle value and the period length value may be provided and updated by software. If the count value is smaller than or equal to the low resolution duty cycle value, a "1" (i.e. an ON signal) may be output to the first synchronous storage 404. If the count value is greater than the low resolution duty cycle value, a "0" (i.e. an OFF signal) may be output to the first synchronous storage 404. The first synchronous storage 404 forwards the received value/signal to the second stage before it receives the next value/signal. This is done as long as the count value is smaller than or equal to the period length value, i.e. for the duration of a whole period. When the count value is greater than the period length value (i.e. after one whole period), the first synchronous storage 404 is cleared, the first counter 402 is reset, and the procedure described above starts again to generate a low resolution PWM duty cycle for the next duty cycle period.

In the second stage, a high resolution duty cycle is generated for the signal comprising the low resolution PWM duty cycle, i.e. the low resolution duty cycle of the signal is adjusted or shifted based on a high resolution duty cycle value to provide the high resolution duty cycle.

The first DLL 414 receives the clock signal and generates therefrom a plurality of different phases and forwards them to the first multiplexer 418. Based on a high resolution duty cycle value, the first multiplexer 418 selects and forwards one phase of the plurality of phases provided by the first DLL 414. The signal received from the first stage is sampled with the selected phase which causes a shift of e.g. the rising edge(s) of the signal. Alternatively, the signal received from the first stage may be sampled with the selected phase such that a shift of e.g. the falling edge(s) of the signal results. The resulting signal is output to the first storage 410 which forwards them to the third stage.

In the third stage, a low resolution dead time is inserted in the signal received from the second stage and in a further signal generated such that it is complementary to the signal received from the second stage. The low resolution dead time is greater than or equal to 0.

The second counter 406 receives the signal provided by the second stage and a shifted clock signal which corresponds to the clock signal, but was shifted in the second stage by means of the phase selected by the first multiplexer. When a transition (from "0" to "1" or from "1" to "0", for example) occurs in the signal received from the second stage, the second counter 406 is reset and starts to count. The count value output by the second counter 406 is compared to a low resolution dead time value. If the count value is smaller than or equal to the low resolution dead time value, a "0" (or "OFF" signal) may be output and otherwise (if the count value is greater than the low resolution dead time value) a "1" (or "ON" signal) may be output. This value (e.g. "0" or "1") and the signal received from the second stage are input to a first AND gate. In addition, this value (e.g. "0" or "1") and the generated complementary signal are input to a second AND gate. The first and second AND gate may forward their respective outputs, the signal and complementary signal with low resolution dead time, to the second storage 408 which forwards them to the fourth stage. However, as the storage 408 is optional, the first and second AND gate may directly forward their respective outputs to the fourth stage if a second storage 408 is not provided.

The low resolution dead time value which may be provided and updated by software may comprise a first low resolution dead time value for rising edges of the PWM duty cycle and a second low resolution dead time value for falling edges of the PWM duty cycle. That is, a first low resolution dead time according to the first low resolution dead time value is inserted at rising edges (e.g. transitions from "0" to "1") of the duty cycles of the signal and the complementary signal and a second low resolution dead time according to the second low resolution dead time value is inserted at falling edges (e.g. transitions from "1" to "0") of the duty cycles of the signal and the complementary signal.

In the fourth stage, high resolution dead times are inserted in the signal and the complementary signal received from the third stage. That is, the low resolution dead times inserted in the signal and the complementary signal in the third stage are adjusted or shifted based on at least one high resolution dead time value to provide high resolution dead times.

A DLL which may be the first DLL 414 of the second stage or may be a second DLL 416 different to the first DLL 414 (as depicted in FIG. 4) receives the clock signal and generates therefrom a plurality of different phases and forwards them to the second multiplexer 420. Based on a high resolution dead time value, the second multiplexer 420 selects and forwards one phase of the plurality of phases provided by the DLL (i.e. the first DLL 414 or the second DLL 416). The signal and the complementary signal received from the third stage are sampled with the selected phase which causes a shift of the e.g. rising edges (or e.g. falling edges) of the signal and the complementary signal.

The high resolution dead time value which may be provided and updated by software may comprise a first high resolution dead time value for rising edges of the PWM signals and a second high resolution dead time value for falling edges of the PWM signals. That is, rising edges (e.g. transitions from "0" to "1") of the PWM signals are shifted according to the first high resolution dead time value and falling edges (e.g. transitions from "1" to "0") of the PWM signals are shifted according to the second high resolution dead time value. For this, an additional multiplexer (not shown in FIG. 4) receiving the plurality of phases from the DLL (i.e. the first DLL 414 or the second DLL 416) is required.

If it is desired to insert different dead times for the PWM signal and the complementary PWM signal, an additional multiplexer (not shown in FIG. 4) receiving the plurality of phases from the DLL (i.e. the first DLL 414 or the second DLL 416) is required. In this case, the second multiplexer 420 may select and forward a first phase according to a first high resolution dead time value for the PWM signal and the additional multiplexer may select and forward a second phase according to a second high resolution dead time value for the complementary PWM signal.

If it is desired to insert not only different dead times at rising and falling edges of the PWM signals, but also different dead times for the PWM signal and the complementary PWM signal, three additional multiplexers (not shown in FIG. 4) receiving the plurality of phases from the DLL (i.e. the first DLL 414 or the second DLL 416) are required.

The low resolution duty cycle value may comprise the most significant bits (MSBs) of a complete duty cycle value and the high resolution duty cycle value comprises the least significant bits (LSBs) of the complete duty cycle value. For example, the MSBs of the duty cycle value may indicate the time during which the PWM duty cycle is high ("ON" or "1") as whole number of clock cycles of the clock signal and the LSBs of the duty cycle value may indicate the additional time during which the PWM duty cycle is also high ("ON" or "1") as fractions of one clock cycle of the clock signal.

The low resolution dead time value may comprise the most significant bits (MSBs) of a complete dead time value and the high resolution dead time value comprises the least significant bits (LSBs) of the complete dead time value. For example, the MSBs of the dead time value may indicate the duration of the dead time as whole number of clock cycles of the clock signal and the LSBs of the dead time value may indicate the additional duration of the dead time as fractions of one clock cycle of the clock signal.

As described above, the high resolution duty cycle and high resolution dead time are inserted by shifting the edges of ON/OFF and/or OFF/ON transitions in the respective signal using suitable phases selected based on values provided and updated by software wherein the high resolution duty cycle values and the high resolution dead time values may be calculated/updated by software in different time slots and/or with different periodicity, i.e. they need not be calculated/updated at the same time. As on-the-fly decoding of counters limiting the speed and/or resolution of dead time insertion is no longer required, highly accurate dead time insertion (i.e. high resolution of dead time insertion) can be achieved. Thus, a PWM signal having highly accurate ON/OFF time and dead time can be generated in the order of picoseconds.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An apparatus for inserting an adjustable high resolution dead time in a PWM signal, the apparatus comprising:
    delaying circuitry configured to receive a clock signal and output a plurality of phases;
    a first multiplexer coupled to the delaying circuitry to receive the plurality of phases and configured to forward a first phase of the plurality of phases based on a first high resolution dead time value; and
    circuitry coupled to the first multiplexer to receive the first phase and configured to receive the PWM signal and shift a rising edge and/or a falling edge of the PWM signal using the received first phase.

2. The apparatus of claim 1, wherein the delaying circuitry is one of a delay locked loop (DLL), a gate delay and a delay string.

3. The apparatus of claim 1, wherein the first high resolution dead time value provided to the multiplexer is updated by software.

4. The apparatus of claim 1, further comprising a second multiplexer coupled to the delaying circuitry and wherein the second multiplexer is configured to forward a second phase of the plurality of phases based on a second high resolution dead time value; and the circuitry is further configured to receive the first phase and the second phase forwarded by the first multiplexer and the second multiplexer and shift a rising edge of the PWM signal using the first phase forwarded by the first multiplexer and to shift a falling edge of the PWM signal using the second phase forwarded by the second multiplexer.

5. The apparatus of claim 1, further comprising a first counter to provide at least one low resolution dead time to be inserted in the PWM signal based on at least one low resolution dead time value.

6. The apparatus of claim 5, wherein the at least one low resolution dead time value comprises a first low resolution dead time value and a second low resolution dead time value, and
    wherein the first counter is configured to provide a first low resolution dead time to be inserted at rising edges of the PWM signal based on the first low resolution dead time value and a second low resolution dead time to be inserted at falling edges of the PWM signal based on the second low resolution dead time value.

7. The apparatus of claim 5, wherein the low resolution dead time value comprises the most significant bits (MSBs) of a complete dead time value.

8. The apparatus of claim 7, wherein the high resolution dead time value comprises the least significant bits (LSBs) of the complete dead time value.

9. The apparatus of claim 5, wherein the high resolution dead time is inserted in the PWM signal having inserted the low resolution dead time.

10. A system for generating PWM signals having an adjustable high resolution dead time, the system comprising:
    a first counter to provide a low resolution duty cycle for a PWM signal;
    a second counter to provide a low resolution dead time;
    a delay locked loop (DLL) configured to receive a clock signal and output a plurality of phases;
    a multiplexer coupled to the DLL to receive the plurality of phases and configured to forward one phase of the plurality of phases based on a high resolution dead time value; and
    circuitry coupled to the multiplexer to receive the one phase and configured to insert a high resolution dead time using the received one phase.

11. The system of claim 10, further comprising:
    a further multiplexer connected to the DLL to receive the plurality of phases output by the DLL and configured to forward a single phase of the plurality of phases based on a high resolution duty cycle value; and
    further circuitry connected to the further multiplexer to receive the single phase forwarded by the further multiplexer to provide a high resolution duty cycle.

12. The system of claim 11, wherein the further circuitry is configured to provide the high resolution duty cycle by shifting a rising edge and/or a falling edge of the low resolution duty cycle of the PWM signal using the received single phase.

13. The system of claim 10, further comprising:
    a further DLL receiving the clock signal and outputting a further plurality of phases;
    a further multiplexer connected to the further DLL to receive the further plurality of phases output by the further DLL and configured to forward a single phase of the further plurality of phases based on a high resolution duty cycle value; and further circuitry connected to the further multiplexer to receive the single phase forwarded by the further multiplexer and configured to provide a high resolution duty cycle using the received single phase.

14. The system of claim 10, wherein the second counter is configured to provide a low resolution dead time to be inserted in the PWM signal and in a complementary PWM signal having a low resolution duty cycle complementary to the low resolution duty cycle of the PWM signal.

15. The system of claim 14, wherein the further circuitry is configured to provide the high resolution duty cycle by shifting, by means of the received single phase, a rising edge and/or a falling edge of the low resolution duty cycle of the PWM signal having the low resolution dead time inserted and/or a rising edge and/or a falling edge of the low resolution duty cycle of the complementary PWM signal having the low resolution dead time inserted.

16. A method for inserting an adjustable high resolution dead time in a PWM signal, the method comprising:
    receiving a clock signal at a delaying circuitry and generating, by the delaying circuitry, a plurality of phases;
    receiving the generated plurality of phases at a first multiplexer;
    selecting and forwarding, by the first multiplexer, a first phase of the plurality of phases based on a first high resolution dead time value; and
    shifting a rising edge and/or a falling edge of the PWM signal using the received first phase forwarded by the first multiplexer.

17. The method of claim 16, wherein the first high resolution dead time value provided to the multiplexer is updated by software.

18. The method of claim 16, further comprising:
receiving the generated plurality of phases at a second multiplexer; and selecting and forwarding, by the second multiplexer, a second phase of the plurality of phases based on a second high resolution dead time value;
wherein the step of shifting a rising edge and/or a falling edge of the PWM signal comprises shifting a rising edge of the PWM signal using the first phase forwarded by the first multiplexer and shifting a falling edge of the PWM signal using the second phase forwarded by the second multiplexer.

19. The method of claim 16, further comprising inserting at least one low resolution dead time in the PWM signal based on at least one low resolution dead time value.

20. The method of claim 19, wherein the at least one low resolution dead time value comprises a first low resolution dead time value and a second low resolution dead time value, and the step of inserting at least one low resolution dead time in the PWM signal comprises inserting a first low resolution dead time at rising edges of the PWM signal based on the first low resolution dead time value and inserting a second low resolution dead time at falling edges of the PWM signal based on the second low resolution dead time value.

21. The method of claim 19, wherein the high resolution dead time is inserted in the PWM signal after inserting the low resolution dead time.

* * * * *